(12) United States Patent
Roth

(10) Patent No.: US 6,662,001 B1
(45) Date of Patent: Dec. 9, 2003

(54) MULTI-HETERODYNE STAGE FOR A RECEIVER OR SPECTRUM ANALYZER

(75) Inventor: Alexander Roth, Dorfen (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 09/477,399

(22) Filed: Jan. 4, 2000

(30) Foreign Application Priority Data

Jan. 18, 1999 (DE) .......................................... 199 01 751

(51) Int. Cl.$^7$ ................................................. H04B 1/26
(52) U.S. Cl. ........................................ 455/314; 455/315
(58) Field of Search ................................ 455/207, 314, 455/315, 323, 324, 326, 310, 318

(56) References Cited

U.S. PATENT DOCUMENTS 3,939,429 A * 2/1976 Lohn et al. ................. 455/315
5,161,254 A * 11/1992 Braathen ..................... 455/310
5,564,098 A * 10/1996 Rodal et al. ................. 455/314
6,385,442 B1 * 5/2002 Vu et al. ..................... 455/318

FOREIGN PATENT DOCUMENTS

DE 30 15 680 11/1980

OTHER PUBLICATIONS

Meinke–Grundlach, Taschenbach der Hochfrequenztechnik (handbook of High Frequency Technology), 5$^{th}$ edition, pp. Q12–Q22.

* cited by examiner

Primary Examiner—Salvatore Cangialosi
(74) Attorney, Agent, or Firm—Birch, Stewart, Kolasch & Birch, LLP

(57) ABSTRACT

In a multi-heterodyne stage for a receiver or spectrum analyzer, a first mixer has a symmetrical output which produces first intermediate-frequency signals of equal-value and are oppositely-phased, which, after passing through an intermediate-frequency filter, are combined in a second mixer having a symmetrical input into a second intermediate frequency.

10 Claims, 1 Drawing Sheet

MULTI-HETERODYNE STAGE FOR A RECEIVER OR SPECTRUM ANALYZER

BACKGROUND OF THE INVENTION

1. Field of the Invention

The present invention relates to a multi-heterodyne stage for a receiver or spectrum analyzer.

2. Description of the Prior Art

Multi-heterodyne stages having two, and in many cases even three successive intermediate-frequency stages, are known (MeinkeGrundlach, *Taschenbuch der Hochfrequenztechnik* (*Handbook of High Frequency Technology*), 5th edition, pp. Q12–Q22). In order to reduce crosstalk of a first mixer (local oscillator) to a second mixer in double- or multi-heterodyne stages, it is known to decouple a portion of performance of a first local oscillator and to add this portion of performance to a first intermediate-frequency signal in a compensatory sense, via an adder arranged in a first intermediate-frequency stage. This known compensation for crosstalk of the first local oscillator is effective in only a very narrow frequency region, since phase and amplitude of a compensation signal must exactly match that of the first intermediate frequency signal. For very small frequency changes, however, the compensation can even exacerbate the noise.

SUMMARY OF THE INVENTION

It is therefore an object of the present invention to expand and improve upon a multiheterodyne stage such that the above-described disadvantages are avoided, and avoid crosstalk over a broad band from the first local oscillator to the second mixer using an uncomplicated structure.

According to a preferred embodiment of the invention, a complete conditioning of the first intermediate-frequency signal is carried out symmetrically, so that corresponding transformers at the output of the first mixer and at the input of the second mixer are unnecessary. The first intermediate-frequency stage is thus very low-loss and has improved noise characteristics. By balancing both intermediate-frequency signals in both parallel branches of the first intermediate-frequency stage to exactly the same levels and opposite phases, which can also be carried out electronically during operation, a sensitivity for low received frequencies is optimized and crosstalk of the first local oscillator over a broadband is suppressed. This symmetry balancing improves also the intermodulation products of a direct order, since these respectively lie in phase at both mixer outputs and thereby make no contribution to the desired signal, but rather are suppressed by a symmetrical intermediate-frequency filter. Any intermodulation products of the third order produced in the two amplifiers are likewise reduced, since amplification is distributed over two individual amplifiers. As a result of the symmetrical feeding of the second mixer, a transformer is unnecessary here as well.

The invention finds application not only for the most-frequently used double heterodyne stages, but also for multi-heterodyne stages in which two or more such successive intermediate-frequency (IF) selection stages are connected in a cascade fashion.

All customary circuits which exhibit a symmetrical output or symmetrical input are suitable as mixers. Proven to be particularly advantageous for this are ordinary diode ring mixers (see for example Meinke-Grundlach, p. Q21), which enable a symmetrical tap, or a symmetrical signal feed, directly at diode diagonals, without additional transformers. Thus results an additional benefit of this invention, that it makes such transformers, previously necessary for diode ring mixers, unnecessary.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION OF THE PREFERRED EMBODIMENTS

Figure 1:
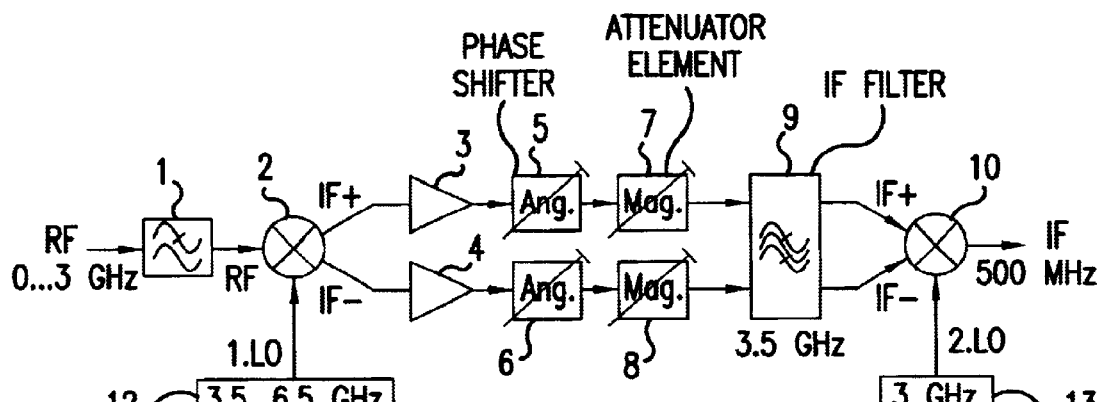
FIG. 1 is a schematic illustration of a double heterodyne stage according to a preferred embodiment of the present invention.

FIG. 1 shows a circuit diagram of a double heterodyne stage as it can be used with a high frequency receiver or spectrum analyzer. After preselection in a low pass 1, an input signal RF that is, for example, to be received in a frequency range between 0 and 3 GHz is fed to a first mixer 2 and there is converted, with a heterodyne frequency 1. LO of a first local oscillator 12, which is, for example, adjustable between 3.5 and 6.5 GHz, into two equal-value, oppositely-phased intermediate-frequency signals IF+ and IF−, which are respectively, separately, amplified in intermediate-frequency to amplifiers 3 and 4 and fed, via adjustable phase shifters 5 and 6 and adjustable attenuator elements 7 and 8, as well as an intermediate-frequency filter 9, to a symmetrical input of a second mixer 10, in which they are converted, with a fixed intermediate frequency 2.LO of 3 GHz, for example, of a second local oscillator 13, to a lower output intermediate frequency of 500 MHz, for example.

Figure 2:
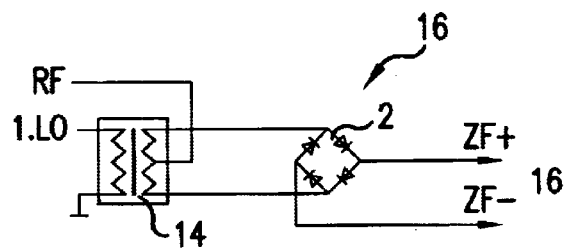
FIG. 2 is a schematic illustration of a first mixer according to a preferred embodiment of the present invention.
Figure 3:
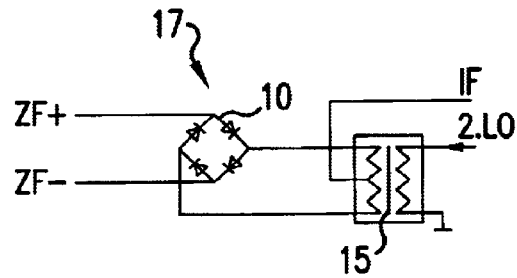
FIG. 3 is a schematic illustration of a second mixer according to a preferred embodiment of the present invention.

FIGS. 2 and 3 depict examples of structures for the two mixers 2 and 10 as diode ring mixers. The first heterodyne frequency 1.LO and the input frequency RF are fed via a symmetrical transformer 14 across one diagonal of the diode ring, and resulting intermediate frequencies IF+ and IF− are directly tapped across the other diode ring diagonal. Since the voltages at this other diode ring diagonal are oppositely-phased, intermediate-frequency signals IF+ and IF− which are equal-value and oppositely-phased are thus produced and fed directly to inputs of amplifiers 3 and 4. The second mixer 10 is similarly constructed, with the equal-value, oppositely-phased intermediate-frequency signals IF+ and IF− coming from an output of the IF filter 9 being fed to a diagonal of a diode ring thereof and with the other diode diagonal being again connected to a transformer 15 thereof to which the second heterodyne frequency 2.L0 is asymmetrically fed, and from which the resulting output intermediate frequency IF is tapped.

Figure 4:
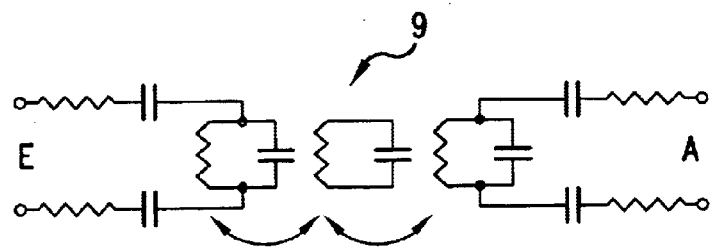
FIG. 4 is a schematic illustration of an intermediate frequency filter according to a preferred embodiment of the present invention.

In the depicted embodiment the intermediate-frequency filter 9 is constructed, in the manner of FIG. 4, as a filter with a symmetrical input E and a symmetrical output A, so that only a single filter is required for both intermediate-frequency signals. Instead of such a single, symmetrical filter, of course, separate respective asymmetrical filters could be provided in each respective branch. All known filter circuits of this type are suited for symmetrical filters, and any customary asymmetrical bandpass filter can be altered through a symmetrical construction to be a symmetrical bandpass filter as in FIG. 4. In the example of FIG. 4, a customary, asymmetrical bandpass filter constructed of three magnetically coupled resonators is modified to an overall symmetrical filter by symmetrical construction of the input and output.

By balancing the phase shifters 5 and 6 and the variable attenuator elements 7 and 8, or the amplification of amplifiers 3 and 4, the intermediate-frequency signals IF+ and IF− in the two branches are adjusted so that they have exactly the same level, and are exactly oppositely-phased. If needed, this balancing could also be performed electronically and automatically by an appropriate control device, for example, even during operation.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. Multi-heterodyne stage circuit comprising:

a first mixer in which an input frequency is converted by an adjustable output frequency of a first local oscillator into a first intermediate-frequency signal, which, after passing through an intermediate-frequency filter, is converted in a second mixer by a fixed output frequency of a second local oscillator into a second intermediate-frequency signal, wherein the first mixer has a symmetrical output, at which two equal-value, oppositely-phased, first intermediate-frequency signals are produced which are amplified by separate intermediate-frequency amplifiers and which, after passing through the intermediate-frequency filter are combined in the second mixer having a symmetrical input into the second intermediate frequency.

2. The multi-heterodyne stage circuit according to claim 1, wherein the first mixer is constructed as a diode ring mixer, and the first intermediate-frequency signals are directly tapped in opposite phase across one diode diagonal thereof.

3. The multi-heterodyne stage circuit according to claim 1, wherein the second mixer is constructed as a diode ring mixer, and the first intermediate-frequency signals are fed directly across a diode diagonal thereof, while the other diode diagonal is connected to a symmetrical transformer.

4. The multi-heterodyne stage circuit according to claim 1, wherein the intermediate-frequency filter has a symmetrical input and a symmetrical output and is common for each of the first intermediate-frequency signals.

5. The multi- heterodyne stage circuit according to claim 1, wherein an adjustable phase shifter and/or an adjustable attenuator element are arranged in at least one branch of the first intermediate-frequency signals.

6. The multi-heterodyne stage circuit according to claim 1, wherein a device is provided to automatically balance both of the first intermediate-frequency signals to the same level and to phase opposition.

7. A multi-heterodyne stage circuit comprising:

a first mixer for receiving an input frequency and an adjustable output frequency, which is outputted by a first local oscillator, the first mixer converting the input frequency via the adjustable output frequency into two first intermediate-frequency signals having an equal value and being oppositely-phased from one another;

intermediate-frequency amplifiers for receiving and amplifying the first intermediate-frequency signals; and a second mixer for receiving the amplified first intermediate-frequency signals via an intermediate-frequency filter and for receiving a fixed output frequency, which is outputted by a second local oscillator, the second mixer converting the amplified first intermediate-frequency signals via the fixed output frequency into a second intermediate-frequency signal, which is outputted from the second mixer.

8. The multi-heterodyne stage circuit according to claim 7, further comprising:

an adjustable phase shifter for receiving and adjusting a phase of at least one of the amplified first intermediate-frequency signals received from at least one of the intermediate-frequency amplifiers.

9. The multi-heterodyne stage circuit according to claim 7, further comprising:

an adjustable alternator element for receiving and adjusting a magnitude of at least one of the amplified first intermediate-frequency signals received from at least one of the intermediate-frequency amplifiers.

10. The multi-heterodyne stage circuit according to claim 7, wherein the first intermediate-frequency signals, which are received by the second mixer, are oppositely phased from one another.

* * * * *